United States Patent [19]

Hayes et al.

[11] Patent Number: 5,781,721
[45] Date of Patent: Jul. 14, 1998

[54] METHOD AND APPARATUS FOR TESTING CACHE RAM RESIDING ON A MICROPROCESSOR

[75] Inventors: Norman M. Hayes, Sunnyvale, Calif.; Adam Malamy, Winchester, Mass.; Rajiv N. Patel, San Jose, Calif.

[73] Assignee: Sun Microsystems, Inc., Mountain View, Calif.

[21] Appl. No.: 714,515

[22] Filed: Sep. 16, 1996

Related U.S. Application Data

[63] Continuation of Ser. No. 449,533, May 24, 1995, abandoned, which is a continuation of Ser. No. 264,245, Jun. 22, 1994, abandoned, which is a continuation of Ser. No. 890,439, May 28, 1992, abandoned.

[51] Int. Cl.$^6$ ................................................. G11C 29/00
[52] U.S. Cl. ................................... 395/183.18; 391/21.2
[58] Field of Search ...................... 395/183.01, 183.18;
371/20.1, 20.4, 21.1, 21.2, 67.1, 71, 72;
364/244, 242.91, 266.4, 243.41, 285; 365/200, 201

[56] References Cited

U.S. PATENT DOCUMENTS

| | | | |
|---|---|---|---|
| 4,575,792 | 3/1986 | Keeley | 364/200 |
| 4,740,971 | 4/1988 | Tam et al. | 371/21 |
| 4,831,625 | 5/1989 | Chiu et al. | 371/51 |
| 4,884,270 | 11/1989 | Chiu et al. | 371/21.1 |
| 5,073,891 | 12/1991 | Patel | 371/21.3 |
| 5,091,845 | 2/1992 | Rubinfeld | 395/425 |
| 5,157,664 | 10/1992 | Waite | 371/10.2 |
| 5,224,101 | 6/1993 | Popyack, Jr. | 371/21.1 |
| 5,228,134 | 7/1993 | MacWilliams et al. | 395/425 |
| 5,249,281 | 9/1993 | Fuccio et al. | 395/575 |
| 5,276,833 | 1/1994 | Auvinen et al. | 395/425 |

*Primary Examiner*—Robert W. Beausoliel, Jr.
*Assistant Examiner*—Albert Décady
*Attorney, Agent, or Firm*—Blakely Sokoloff Taylor & Zafman

[57] ABSTRACT

An apparatus and method for enabling a cache controller and address and data buses of a microprocessor with an on-board cache to provide a SRAM test mode for testing the on-board cache. Upon assertion of a SRAM test signal to a SRAM test pin on the microprocessor chip, the cache and bus controllers cease normal functionality and permit data to be written to, and read from, individual addresses within the on-board cache as though the on-board cache is simple SRAM. After the chip is reset, standard SRAM tests can then be implemented by reading and writing data to selected cache memory addresses as though the cache memory were SRAM. Upon completion of the tests, the SRAM test signal is deasserted and the cache and bus controllers resume normal operating functionality. A reset signal is then applied to the microprocessor to reinitialize control logic employed within the microprocessor. In this way, cache memory on-board a microprocessor can be tested using standard SRAM testing algorithms and equipment thereby eliminating a need for specialized test equipment to test cache memory contained on a microprocessor chip.

19 Claims, 2 Drawing Sheets

METHOD AND APPARATUS FOR TESTING CACHE RAM RESIDING ON A MICROPROCESSOR

This application contains subject matter which is related to the subject matter of the following applications assigned to the same assignee: "Multiple Bank Column Redundancy Initialization Controller for Cache RAM"(U.S. patent application Ser. No. 07/890,549) which was filed on May 5, 1992 and "Methods and Apparatus for Implementing a Pseudo-LRU Cache Memory Replacement Scheme with a Locking Feature" (U.S. patent application Ser. No. 07/875,357) which was filed on Apr. 29, 1992. These co-pending applications are incorporated by reference herein.

BACKGROUND OF THE INVENTION

(1) Field of the Invention

The present invention relates to a method and apparatus for testing to find defects in an integrated circuit chip. More specifically, the present invention permits cache RAM on a microprocessor to be tested as though it is static RAM.

(2) Prior Art

It is quite common for a microprocessor integrated circuit chip to include an on-board cache random access memory (RAM). It is also quite common for the on-board cache RAM to feature parallel data paths such as a 32-byte or a 64-byte bus for transferring data into and out of its memory storage. Likewise, most cache memory storage comprises semi-conductor memories organized in rectangular arrays of rows and columns on very-large-scale integrated (VLSI) circuits. The intersection of one row and one column results in a storage element called a "cell". Each cell is capable of storing a binary bit of data. To write data into, and read data from, a row or column of cells, an address is assigned to each row or column of cells. Access to the address is provided by a binary-coded address presented as input to address decoders that select a row or column for a write or read operation. As semi-conductor memories become more and more dense, the arrays of cells become more and more susceptible to the presence of defects which could impede or corrupt the flow of data through any of the desired data paths.

Defects in semi-conductor memories occur during the fabrication, packaging and field operation of an integrated circuit. Under the rubric of defects, one may include wafer defects, oxide defects, metallization defects, interconnect defects, contamination defects, unintended or missing connections, missing or extra contacts and others.

Unless a defect can be repaired, a defective microprocessor chip will not function properly and is unusable. A detailed description of a method and apparatus for repairing defects in cache RAM of a microprocessor appears in co-pending U.S. patent application Ser. No. 07/890,549, titled: "Multiple Bank Column Redundancy Initialization Controller for Cache RAM" which was filed on May 5, 1992 and is hereby incorporated fully by reference. However, before defective cache RAM can be repaired, the addresses, and thereby, the location of each defect must be ascertained.

A cache RAM is a special memory subsystem in which frequently used data values are duplicated for quick access. A memory cache stores the contents of frequently accessed RAM locations and the addresses where these data items are stored. When the processor references an address in memory, the cache controller determines whether the cache holds data for the address. If the cache does hold the data for the address, the data is provided to the processor. If the cache does not contain the desired data, a regular memory access occurs. A cache is useful when RAM accesses are slow compared with the microprocessor speed because cache memory is always faster than main RAM memory.

When a microprocessor has a relatively large on-chip cache, and an ability to repair that cache memory is present, it becomes desirable to test the chip as a static random access memory (SRAM), rather than as a CPU. Testing the chip as SRAM allows the use of standard memory test hardware, which is associated with laser-repair hardware. This, in turn, lowers production costs and speeds throughput.

SUMMARY OF THE INVENTION

It is therefore an object of the present invention to test cache memory on-board a microprocessor using static random access memory (SRAM) test processes.

An apparatus and method are disclosed for enabling the cache controller and address and data buses of a microprocessor with an on-board cache to provide a SRAM test mode for testing the on-board cache. Upon assertion of a SRAM test signal to a SRAM test pin on the microprocessor chip, the cache and bus controllers cease normal functionality and permit data to be written to, and read from, individual addresses within the on-board cache as though the on-board cache is simple SRAM. After the chip is reset, standard SRAM tests can then be implemented by reading and writing data to selected cache memory addresses as though the cache memory were SRAM. Upon completion of the tests, the SRAM test signal is deasserted and the cache and bus controllers resume normal operating functionality. A reset signal is then applied to the microprocessor to reinitialize the control logic. Thus, cache memory on-board a microprocessor can be tested using standard SRAM testing algorithms and equipment thereby eliminating the need for specialized test equipment to test cache memory contained on a microprocessor chip.

BRIEF DESCRIPTION OF THE DRAWINGS

The objects, features, and advantages of the method and apparatus of the present invention will be apparent from the following detailed description of the invention in which.

DETAILED DESCRIPTION OF THE INVENTION

A method and apparatus for testing a cache residing on a microprocessor integrated circuit chip is disclosed. In the following description, for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatical or block diagram form in order not to obscure the present invention unnecessarily. For example, the phrase "instruction and data caches" refers to both the tag and the data portions of the instruction cache and the data cache.

Figure 1:
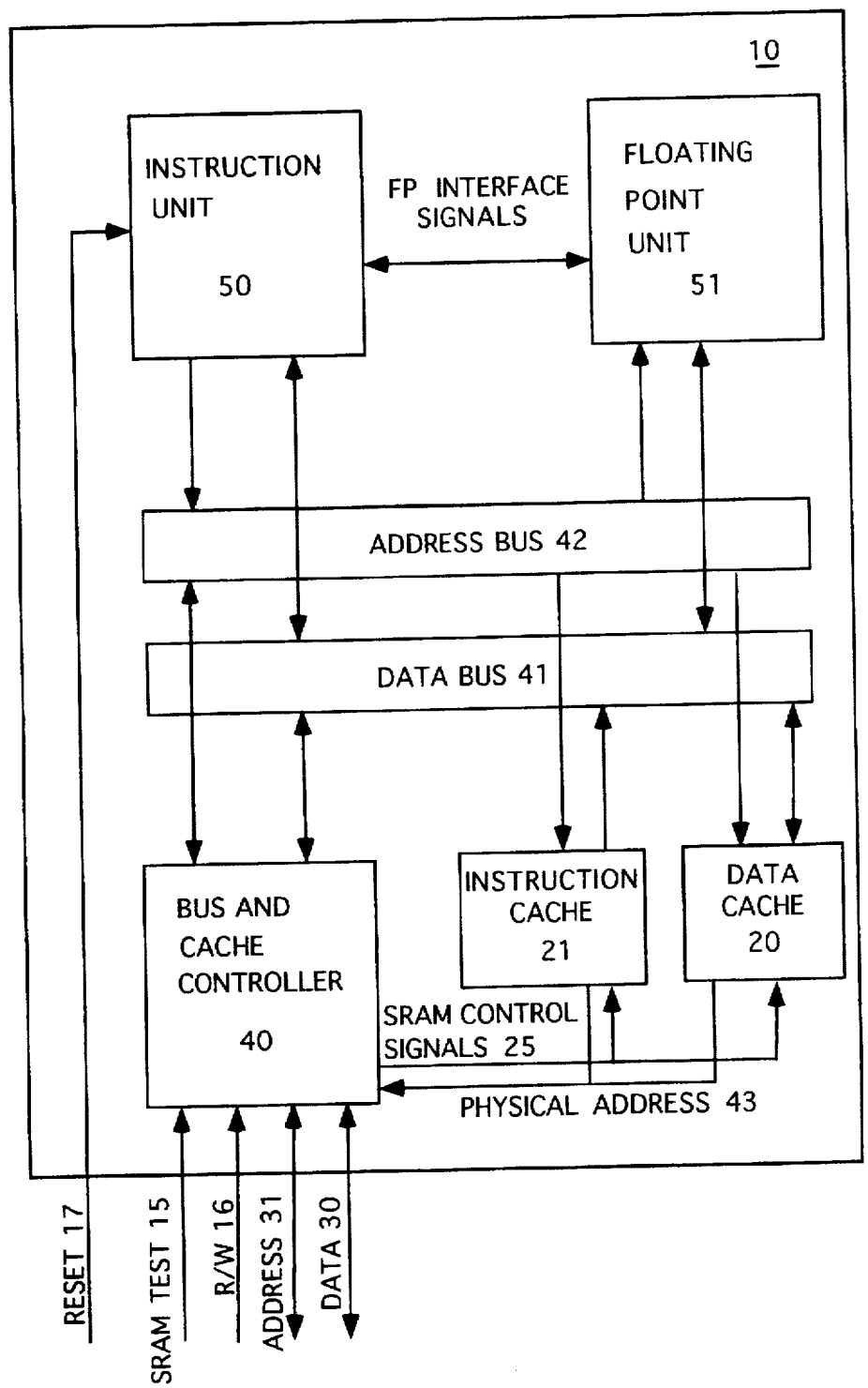
FIG. 1 illustrates the architectural partitioning of a microprocessor with an on-board cache RAM.

Referring now to FIG. 1, the architectural partitioning for a microprocessor 10 with on-board data cache 20 and on-board instruction cache 21 is illustrated. Data and address information enter and leave the microprocessor 10 through data 30 and address 31 signal lines which are coupled to a bus and cache controller 40. The bus and cache controller 40 is coupled to a data bus 41 and an address bus 42. Data bus 41 and address bus 42 are internal to the microprocessor 10. In one embodiment of the present invention, the address bus 42 is a virtual address bus and the bus and cache controller 40 includes a memory management unit (MMU) (not shown) which converts virtual addresses to physical addresses 43. An instruction unit 50, floating point unit 51, instruction cache RAM 21 and data cache RAM 20 are also coupled to the address bus 42 and data bus 41. The instruction unit 50 is also coupled to the floating point unit 51 so that floating point interface signals may be exchanged between the two units. Furthermore, the bus and cache controller 40 is coupled to the instruction cache 21 and the data cache 20 by cache RAM control signal lines 25.

In one embodiment of the present invention, a SRAM test signal line 15 for providing a SRAM test signal is coupled to the bus and cache controller 40. A read/write signal line 16 is also coupled to the bus and cache controller 40 which provides a read/write signal that indicates whether a read or write operation is being performed. Furthermore, a reset signal line 17 is coupled to the instruction unit 50 for providing the instruction unit 50 with a reset signal. Assertion of the reset signal causes the microprocessor 10 to enter a reset mode which initializes the microprocessor 10 to a known state in a manner well known to one skilled in the art.

Signal pins on the microprocessor 10 carry the SRAM test, read/write, reset, address and data signals onto the chip. During normal operation, when the SRAM test signal is not asserted, each of the units on the microprocessor 10 normally function. The bus and cache controller 40 controls the flow of data to and from the cache memory. For example, if a read request is issued, the bus and cache controller 40 determines whether the cache holds data for that address and, either supplies the data immediately to the requesting processor, or causes a regular memory access to occur in order to provide the requested data. However, upon assertion of the SRAM test signal, the bus and cache controller 40 enters SRAM test mode. When placed in the SRAM test mode, the bus and cache controller 40 ignores normal communications and ceases to control normal accesses to the cache memory. Instead, the bus and cache controller 40 simply functions as a conduit for test addresses and data. If the read/write signal indicates that a write operation is underway, the bus and cache controller 40 sends test data input on the data lines 30 to the address located in instruction cache 21 or data cache 20 which is indicated on the address lines 31. If the read/write signal indicates a read operation, the bus and cache controller 40 causes data located in the instruction cache 21 or the data cache 20 address on the address lines 31 to be driven onto data lines 30. By temporarily halting the normal operation of the bus and cache controller 40 and causing it to operate as a conduit, the instruction cache 21 and data cache 20 can be accessed in the same manner as SRAM. The SRAM test mode continues until the SRAM test signal is no longer asserted.

In one embodiment of the present invention, a write to either the instruction cache 21 or the data cache 20 is performed by driving data to be written onto the data lines 30 and the address to which the data is to be written onto the address lines 31 of the microprocessor 10. The read/write signal is also set to indicate that a write operation is underway. As long as the bus and cache controller 40 senses the assertion of the SRAM test signal, the bus and cache controller 40 does not function in a normal manner and simply routes the data on the data lines 30 to the cache address identified by the data on the address lines 31.

In a similar manner, data can be read from the instruction cache 21 or data cache 20 in the SRAM test mode. During a SRAM test read operation, the instruction cache 21 or data cache 20 address from which data is to be read is driven onto the address 31 lines of the microprocessor 10. The read/write signal line is set to indicate that a read, rather than a write, operation is under way. So long as the bus and cache controller 40 senses the assertion of the SRAM test signal, it will cease to function in a normal manner. Upon sensing assertion of the address on the address 31 lines and sensing that the read/write signal indicates a read operation, the bus and cache controller 40 retrieves the data stored at the requested address from the instruction 21 or data 20 cache which contains the requested address and then drives the requested data onto the data lines 30 of the microprocessor 10. In an alternate embodiment of the present invention, a common internal address/data bus could be used by employing techniques well known in the art.

It will be appreciated by one skilled in the art that, when the microprocessor 10 is placed in SRAM test mode, the instruction 21 and data 20 caches respond as though they are SRAM. Numerous SRAM test devices and algorithms exist and are well known in the art. The SRAM test equipment is widely available and easily modifiable to provide the SRAM test signal necessary to place a microprocessor 10 into the SRAM test mode and then test the microprocessor 10 as though it were SRAM. Toward that end, although the data lines 30 of one embodiment of the invention can carry up to 64 bits, only eight unique bits are read or written during a SRAM read or write operation. All 64 bits are actually written, the incoming byte is duplicated across the eight data bytes which together form the 64 bits. This is because most standard SRAM testers and test algorithms are designed to work with eight bits per address. By reading or writing only eight unique bits per SRAM test read or write operation, the instruction 21 and data 20 caches of the microprocessor 10 placed in SRAM test mode can be tested by a wide variety of readily available testers.

Figure 2:
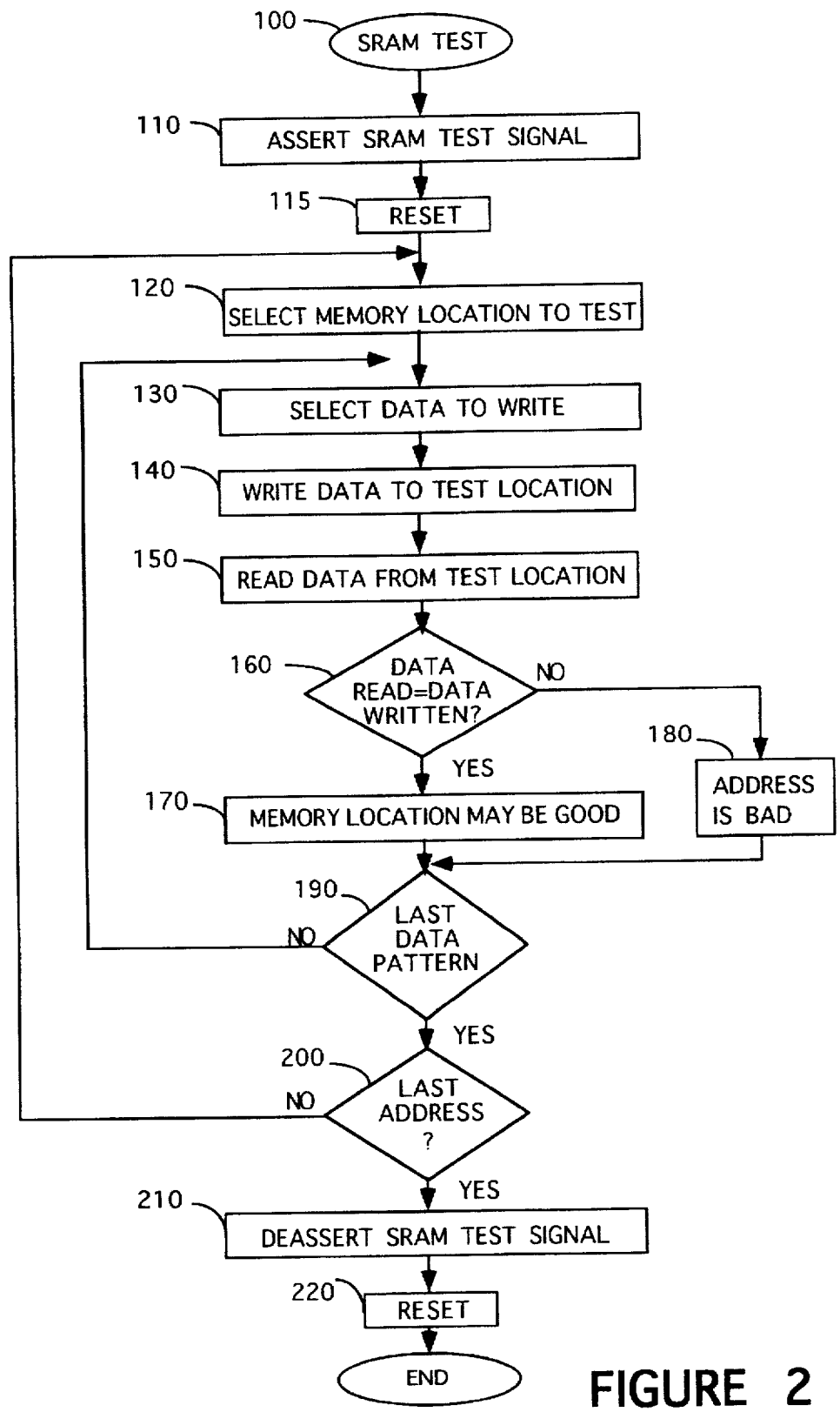
FIG. 2 is a flow diagram for a representative SRAM mode test of the onboard cache of the microprocessor system of FIG. 1.

Referring now to FIG. 2, a flow diagram for a representative test of the onboard instruction 21 or data 20 cache of microprocessor 10 using the teachings of the present invention is illustrated. The test commences with the assertion of the SRAM test signal to place the microprocessor 10 in SRAM test mode (block 110) and application of a reset pulse (block 115). A memory location of the instruction 21 or data 20 cache to test is then selected and driven onto the address lines 31 of the microprocessor 10 (block 120).

A data pattern to be written to the selected memory location is selected (block 130). Algorithms are well known in the art which vary the data written to, and then read from, a test address to verify that all of the signal paths of the test address are functioning properly. If, the algorithms determine that the address location is defective, the algorithms can also isolate the defective bit or bits of the address under test.

The read/write signal is set to indicate a write operation, the data to be written to the selected address on the microprocessor 10 is driven onto the data lines 30 of the microprocessor 10, and the data is written to the address under test (block 140).

The data is then retrieved from the test address by setting the read/write signal to indicate that data should be read from the address which is still being asserted on the address lines 31 of the microprocessor 10 (block 150). The data read from the address under test is then compared to the data written to the address under test (block 160). If the data read from the address under test is the same as the data written to it, then the memory location may be good (block 170). However, if the data read from the address under test is not the same as the data written to the address (block 180), then the address is defective.

Once an address has been determined to be free of defects, or the address has been determined to be defective and the defective bits of the address have been isolated, a next address to be tested is tested in the same manner until all addresses to be tested have been tested (block 200). At the end of the SRAM test, the SRAM test signal is deasserted to remove the microprocessor 10 from SRAM test mode (block 210).

In one embodiment of the present invention, the instruction cache 21 or data cache 20 would be tested on a stand alone tester in the fabrication house where the microprocessor 10 chip was manufactured. However, in an alternate embodiment of the invention, the microprocessor 10 can be tested while it resides within a functioning computer system. If the microprocessor 10 is being tested within the functioning computer system, it will be necessary to assert the reset signal to flush the data written to the caches during the SRAM test thereby returning the microprocessor 10 to a known state of operation before normal function is restored.

If defects are detected in the instruction 21 or data 20 cache memory of the microprocessor 10, the microprocessor 10 may be repairable through the use of techniques such as those disclosed in the above-mentioned co-pending U.S. patent application Ser. No. 07/890,549 or other techniques well known in the art.

Alternately, defective areas of the cache may be avoided by using software to employ techniques such as those disclosed in co-pending U.S. patent application Ser. No. 07/890,549 entitled "Methods and Apparatus for Implementing a Pseudo-LRU Cache Memory Replacement Scheme with a Locking Feature" which was filed on Apr. 29, 1992 and hereby incorporated fully by reference.

While the method of the present invention has been described in terms of its presently preferred and alternate embodiments, those skilled in the art will recognize that the method of the present invention is not limited to the embodiments described. The method of the present invention may be practiced with modification and alteration within the spirit and scope of the appended claims. The specifications and drawings are, accordingly, to be regarded in an illustrative rather than a restrictive sense.

What is claimed is:

1. In a microprocessor chip having an instruction execution circuit, a tag portion and a data portion of an on-board cache of a first word size and a cache controller means which is coupled to said instruction execution circuit and said on-board cache for controlling said on-board cache during a normal operating mode and is adapted to interface with a static random access memory ("SRAM") test device of a second word size, a method for testing said on-board cache within said microprocessor chip comprises the steps of:

a) placing said microprocessor chip from the normal operating mode into a static random access memory (SRAM) test mode by at least providing a SRAM test signal to the cache controller means to cause the cache controller means to operate as a conduit;

b) writing test data to said tag portion and said data portion of said on-board cache from the SRAM test device through said cache controller means when said cache controller means detects said microprocessor chip being placed in said SRAM test mode;

c) reading test data previously written to said tag portion and said data portion of said on-board cache by the SRAM test device by transferring said written test data through said cache controller means to the SRAM test device when said cache controller means detects said microprocessor chip being placed in said SRAM test mode;

d) determining by the SRAM test device if said written test data being read from said tag portion and said data portion of said on-board cache is equal to said test data being written into said tag portion and said data portion of said on-board cache when said microprocessor chip is in said SRAM test mode; and e) configuring said cache controller to fit said test data of said second word size into said on-board cache of said first word size.

2. The method as set forth in claim 1, wherein, said step a) comprises providing a reset signal to said instruction execution circuit of said microprocessor chip for resetting said microprocessor chip;

said step b) comprises providing and maintaining an address, providing a write signal and providing said test data to said cache controller means, said address addressing a cache location of said on-board cache, said cache controller means detecting said SRAM test signal, driving and maintaining said address to said on-board cache, driving said test data to said on-board cache causing said test data to be written into said tag portion and said data portion of said cache location, and skipping all other write cache operations normally performed with said address, said write signal and said write test data under said normal operation mode;

said step c) comprises providing a read signal to said cache controller means, said cache controller means detecting said SRAM test signal, driving said read signal to said on-board cache causing said written test data to be read and output from said tag portion and said data portion of said cache location, and skipping read cache operations normally performed with said address and said read signal under said normal operating mode.

3. The method as set forth in claim 2, wherein, said SRAM test signal, said reset signal, said address, said write signal, said test data, and said read signal are provided and maintained to said instruction execution circuit and said cache controller means accordingly in said steps a) through c) using said SRAM test device of said second word size.

4. The method as set forth in claim 2, wherein, said cache controller means comprises a bus and cache controller, an address bus, and a data bus, said address and data busses being coupled to said bus and cache controller and said on-board cache;

said bus and cache controller receives said SRAM test signal, said address, said write signal, said test data, and said read data provided and maintained accordingly in said steps a) through c);

said bus and cache controller drives and maintains said address to said on-board cache in said step b) by driving and maintaining said address onto said address bus;

said bus and cache controller drives said write signal and said test data to said on-board cache in said step b) by driving said write signal onto said address bus, and said test data onto said data bus;

said bus and cache controller drives said read signal to said on-board cache in said step c) by driving said read signal onto said address bus; and said bus and cache controller causes said written test data to be driven out from said on-board cache in said step c) by causing said written test data to be driven from said on-board cache onto said data bus.

5. The method as set forth in claim 1, wherein, said method further comprises the step of:

f) returning said microprocessor from said SRAM test mode back to said normal operating mode.

6. The method as set forth in claim 5, wherein, said step f) comprises discontinuing said SRAM test signal maintained for said cache controller means, and providing a reset signal to said instruction execution circuit of said microprocessor chip, said discontinuance of said SRAM test signal returning said microprocessor from said SRAM test mode back to said normal operating mode, said SRAM test signal being previously provided and maintained for said cache controller means to place said microprocessor chip from said normal operating mode into said SRAM test mode, said reset signal resetting said microprocessor chip.

7. The method as set forth in claim 1, wherein, said on-board cache is a selected one of an instruction cache, a data cache, and a combined instruction and data cache.

8. Adapted for testing by a static random access memory (SRAM) test device of a first word size, an integrated circuit chip of a second word size comprising:

an instruction execution circuit, said instruction execution circuit issues requests to read and write data when the integrated circuit chip is in a processing mode and remains idle when the integrated circuit chip is in a reset mode;

a tag portion and a data portion of a cache coupled to said instruction execution circuit, said cache is used to store at least said data;

at least a first input contact providing a data path to transfer test data from the SRAM test device to said tag portion and said data portion of said cache within the integrated circuit chip and to transfer test data from said tag portion and said data portion of said cache to the SRAM test device such that the test data of said first word size is fitted into said cache of said second word size; and cache controller circuit coupled to said cache, said first input contact and to said instruction execution circuit, said cache controller circuit (i) controls propagation of said data by determining if said data requested by said instruction execution circuit is located in said cache when the integrated circuit chip is in a normal mode, and (ii) writes and reads test data placed on said first input contact to and from said cache without controlling propagation of said test data when the integrated circuit chip is in a test mode.

9. The integrated circuit chip as set forth in claim 8, wherein said cache controller circuit also writes and reads data from said SRAM cache to said instruction execution circuit in said normal mode.

10. The integrated circuit chip as set forth in claim 9, further comprising:

a second input contact coupled to said cache controller circuit for receiving a signal that places said cache controller circuit in either said normal mode or said test mode.

11. The integrated circuit chip as set forth in claim 10, further comprising:

a third input contact for receiving a third signal for placing said instruction execution circuit in either said processing mode or said reset mode.

12. The integrated circuit chip as set forth in claim 11, further comprising:

a CPU bus for transmitting data between said cache and said instruction execution circuit.

13. The integrated circuit chip as set forth in claim 12, wherein:

said cache controller circuit reads and writes to said cache to said CPU bus in said normal mode, and reads and writes to said cache only from said first input contact when in said test mode.

14. The integrated circuit chip as set forth in claim 9, wherein:

said cache ignores requests to read and write data from said instruction execution circuit when in said test mode.

15. A method for simplifying testing of an integrated circuit chip of a first word size through a static random access memory test device of a second word size, the method comprising the steps of:

providing an instruction execution circuit for issuing requests to read and write data in a processing mode;

providing a tag portion and a data portion of a cache for storing said data, said tag portion and said data portion of said cache being coupled to said instruction execution circuit;

providing at least a first input contact to the integrated circuit chip for transmitting and receiving data to and from the integrated circuit chip;

providing a cache controller circuit coupled to said tag portion and said data portion of said cache, said first input contact and to said instruction execution circuit, for determining if said data requested by said instruction execution circuit is located in said tag portion and said data portion of said cache when the integrated circuit chip is in a normal mode, and for writing and reading test data placed on said first input contact to and from said tag portion and said data portion of said cache when the integrated circuit chip is in a test mode; and configuring said cache controller to fit said data of said second word size into said cache of said first word size.

16. The method set forth in claim 15, further comprising the steps of:

providing a second contact located on the external surface and coupled to said cache controller circuit for receiving a signal that places said cache controller circuit in either said normal mode, or said test mode.

17. The method set forth in claim 16, further comprising the step of:

providing a third contact located on the external surface for receiving a third signal for placing said instruction execution circuit in either said processing mode, or said reset mode.

18. The method set forth in claim 17, further comprising the step of:

providing a CPU bus for transmitting data between said SRAM cache and said instruction execution circuit.

19. The method set forth in claim 18, further comprising the step of:

providing a set of input contacts located on the external surface for transmitting and receiving data to and from the SRAM cache coupled only to said cache controller.

* * * * *